United States Patent
Bobde et al.

(10) Patent No.: US 8,283,213 B2
(45) Date of Patent: Oct. 9, 2012

(54) METHOD OF MINIMIZING FIELD STOP INSULATED GATE BIPOLAR TRANSISTOR (IGBT) BUFFER AND EMITTER CHARGE VARIATION

(75) Inventors: Madhur Bobde, San Jose, CA (US);
Anup Bhalla, Santa Clara, CA (US);
Lingpeng Guan, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 154 days.

(21) Appl. No.: 12/804,838

(22) Filed: Jul. 30, 2010

(65) Prior Publication Data
US 2012/0025261 A1 Feb. 2, 2012

(51) Int. Cl.
*H01L 21/332* (2006.01)

(52) U.S. Cl. .......... 438/140; 438/138; 438/E21.388

(58) Field of Classification Search .......... 257/139, 257/E29.197, E21.388; 438/133, 273, 147, 438/136, 137, 138, 140
See application file for complete search history.

(56) References Cited

U.S. PATENT DOCUMENTS

| 6,885,063 B2 * | 4/2005 | Tagami et al. ............ 257/341 |
| 2007/0181927 A1 * | 8/2007 | Yedinak et al. ............ 257/302 |

* cited by examiner

*Primary Examiner* — A. Sefer
*Assistant Examiner* — Nikolay Yushin
(74) *Attorney, Agent, or Firm* — Bo-In Lin

(57) ABSTRACT

This invention discloses an insulated gate bipolar transistor (IGBT) formed in a semiconductor substrate. The IGBT comprises a buffer layer of a first conductivity type formed below an epitaxial layer of the first conductivity having body and source regions therein. The IGBT further includes a lowly doped substrate layer below the buffer layer and a dopant layer of a second conductivity type disposed below the lowly doped substrate layer and above a drain electrode of said IGBT attached to a bottom surface of said semiconductor substrate wherein the dopant layer of the second conductivity type has a higher dopant concentration than the lowly doped substrate layer.

10 Claims, 7 Drawing Sheets

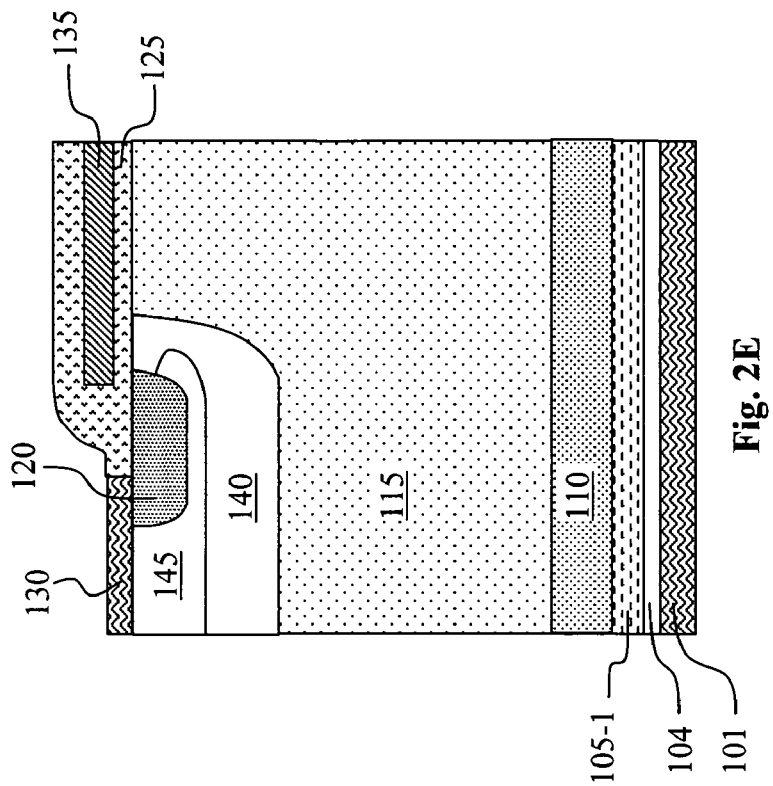
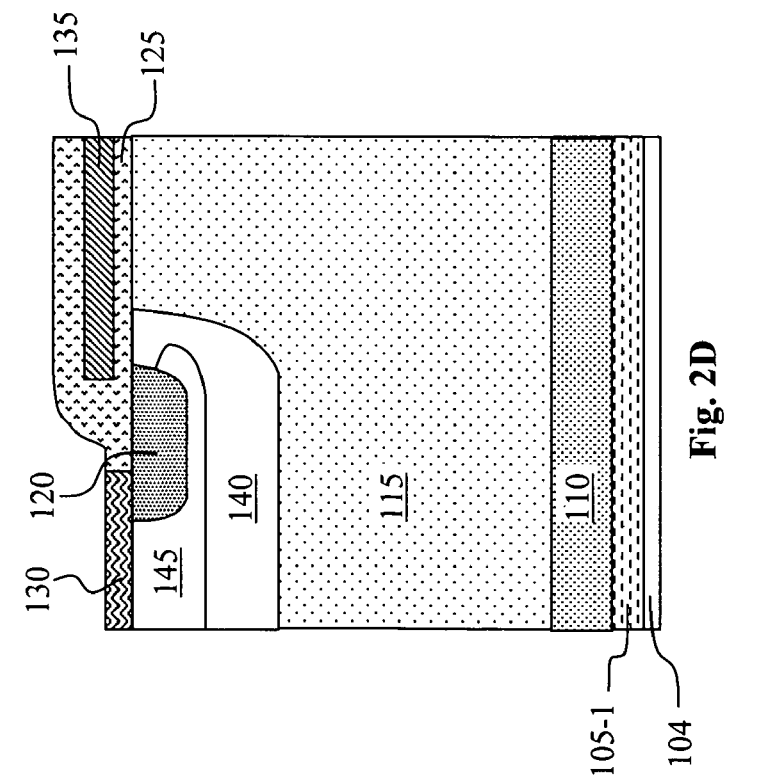

METHOD OF MINIMIZING FIELD STOP INSULATED GATE BIPOLAR TRANSISTOR (IGBT) BUFFER AND EMITTER CHARGE VARIATION

BACKGROUND OF THE INVENTION

1. Field of the Invention

The invention relates generally to semiconductor power devices. More particularly, this invention relates to new configurations and methods for manufacturing field stop insulated gate bipolar transistor (IGBT) to minimize the buffer and emitter charge variations.

2. Description of the Prior Art

Conventional technologies to configure and manufacture vertical power devices, particularly the field stop insulated gate bipolar transistor (IGBT), have difficulties and limitations due to the uncertainties in controlling the thickness and dopant concentration of the backside layers.

Field stop IGBTs include a (n-type) field stop (buffer) layer at the bottom of the drift region, and a thin implanted (p-type) collector region below the buffer layer. The collector region has a reduced number of charges compared to punch through IGBTs, and so has controlled minority carrier injection. The buffer layer terminates the electric field (i.e., acts as a "field stop"). For field stop IGBTs, it is important to carefully control the charge levels in the buffer layer and the collector layer.

FIG. 1 shows a conventional field-stop IGBT formed in an N− epitaxial layer having a thickness of approximately 45 micrometers and dopant concentration of approximately $2E14/cm^3$. A semiconductor substrate supports the epitaxial layer having backside layers including an N-buffer layer with $2.5E12/cm^2$ charge and a P collector layer with $1E13/cm^2$ charge. A drain/collector electrode is attached at the bottom surface to the P-collector layer.

In order to ensure a high breakdown voltage for a field stop IGBT, a tight control on the charge levels of the backside layers is required. It is further necessary to control the backside layer charges with a high degree of accuracy to achieve a good trade-off between the conduction loss ($V_{CE}$, sat) and switching losses.

To form the backside layers, conventional methods of manufacturing implement backside processing steps as shown in FIGS. 1A-1 to 1A-5 and FIGS. 1B-1 to 1B-5. FIG. 1A-1 shows a starting material of an N type silicon layer having a dopant concentration of $2E14/cm^3$. The starting material is a single semiconductor substrate layer, without an additional epitaxial layer atop. In FIG. 1A-2, the top side processing steps are completed to form the IGBT structures on the top side of the substrate. In FIG. 1A-3, a backside grinding is performed to reduce the starting substrate layer to a predefined thickness. In FIG. 1A-4, a backside N-type implant is performed to first form a N buffer layer at the bottom of the N− epitaxial layer and then a P-type implant is carried out to form the bottom P collector layer. In FIG. 1A-5, a backside metal layer is formed to function as the drain/collector electrode. The processes require two backside implants and activation/anneal operations. The anneal processes on the backside layer can only be performed at a low temperature due to the limitations imposed by the already existing top metal layer—the metal layers cannot withstand a high annealing temperature. However, such limitation causes poor and irregular performance of the N-buffer layer to block the leakage current. The poor performance is caused by the fact that the N-buffer is formed as a blocking junction, and the block junction requires an anneal process to repair all crystal damages or the device will have a high leakage current.

FIGS. 1B-1 to 1B-5 illustrate an alternative conventional method for manufacturing the IGBT. In FIG. 1B-1, a starting material of silicon substrate is formed with a lower N-substrate layer having the volumetric doping concentration of the N-buffer layer supporting an N-epitaxial layer over it having a dopant concentration of $2E14/cm^3$. In FIG. 1B-2, the top processing steps are completed to form the IGBT structures on the top side of the substrate. In FIG. 1B-3, a backside grinding is performed to reduce the lower N substrate layer to a predefined thickness. This pre-defined thickness together with the volumetric doping concentration of the lower N substrate layer ideally result in the desired per area charge level (e.g., $2.5E12/cm^2$) of the N buffer region. In FIG. 1B-4, a backside P-type implant is carried out to form the bottom P type layer. In FIG. 1A-5, a backside metal layer is formed to function as the drain electrode. This method does not require a high temperature anneal after backgrinding for the N buffer layer because the N buffer layer is already doped as the starting lower substrate layer. However, the manufacturing processes encounter a difficulty being unable to accurately control the back grinding thickness within a tightly controlled tolerance. Variations in the back grinding thickness will result in varying thicknesses of the N buffer layer and thus varying charge levels in the N buffer layer. Performance of the IGBT device may be adversely affected due to the high sensitivity of such device to the N-buffer charge variations caused by thickness uncertainties of the N-buffer layer. Furthermore, the performance of device blocking/PNP gain are also very sensitive to the N-buffer charges and that again may be jeopardized by the uncertainties of thickness control in the backside grinding process.

Accordingly, there is a need to provide a new manufacturing method to resolve the above discussed difficulties and limitations. More particularly, it is further desired that the new manufacturing method can simplify the processing steps such that cost savings, production yields and device performance reliability may also be achieved in a new and improved field stop IGBT.

SUMMARY OF THE PRESENT INVENTION

It is therefore an aspect of the present invention to provide a new and improved device configuration and method for manufacturing a semiconductor power device such as an IGBT to simplify the backside processing steps because the method of manufacturing the IGBT requires only one implant operation on the backside.

Another aspect of this invention is to provide a new and improved configuration and method of manufacturing a semiconductor power device such as an IGBT with a buffer region that can achieve improved charge control where the buffer region has its dopants fully activated before the top side metal is formed such that the buffer region can be formed as a substantially defect free layer to provide significantly improved performance. In fact the buffer region is formed as part of the starting wafer with its thickness and charge level already set, before top side processing.

Another aspect of this invention is to provide a new and improved configuration and method of manufacturing a semiconductor power device such as an IGBT wherein a lowly doped layer is formed below the buffer layer such that the variations of a backside grinding back process has substantially negligible effect on buffer layer charge level or collector layer charge level and on the device collector-emitter voltage $V_{CE}$, sat/BV/Eoff (saturation/breakdown voltage/turn-off loss) characteristics.

Briefly in a preferred embodiment this invention discloses an insulated gate bipolar transistor (IGBT) formed in a semiconductor substrate. The IGBT comprises a buffer layer of a first conductivity type formed below an epitaxial layer of the first conductivity type. The epitaxial layer has body and source regions therein and supporting a gate electrode of the IGBT thereon. The IGBT further includes lowly doped layer and a dopant layer of a second conductivity type disposed below the buffer layer and above a collector electrode of said IGBT attached to a bottom surface of said semiconductor substrate wherein the dopant layer of the second conductivity type has a higher dopant concentration than the lowly doped layer, wherein the lowly doped layer is disposed above the dopant layer of the second conductivity type. The lowly doped layer can be lowly doped n-type or p-type, or it may be intrinsic semiconductor. The dopant layer of second conductivity type at the bottom can act as the collector region of the IGBT.

Furthermore, this invention discloses a method for manufacturing semiconductor power devices that comprises a step of growing an epitaxial layer of a first conductivity type on a semiconductor substrate of a second conductivity type. The bottom of the epitaxial layer is formed having a higher doped portion to serve as the buffer layer. The method thus forms a bottom portion of the epitaxial layer as a buffer layer having a precisely controlled amount of layer charges before carrying out processing steps on a top portion of the epitaxial layer to form a top portion of the semiconductor power device.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 1A-1 to 1A-5 and 1B-1 to 1B-5 are two series of cross sectional views for illustrating the processing steps for manufacturing the conventional IGBT of FIG. 1.

FIGS. 2A to 2E are a series of cross sectional views for illustrating the processing steps for manufacturing an IGBT of this invention.

DETAILED DESCRIPTION OF THE METHOD

This invention discloses a method for manufacturing a field stop insulated gate bipolar transistor (IGBT) with improved backside processing steps to simplify the manufacturing processes because only a single implant operation is required on the backside. The new method of manufacturing the IGBT further improve the control of the layer charges of the buffer layer (i.e. field stop) and quality of the layer because the buffer layer is already formed together with its dopants in crystalline form through epitaxial growth before the processing steps are carried out on the top portion of the semiconductor substrate to form the top metal layers of the IGBT device. A later annealing process is not necessary to activate the buffer layer dopants because all the dopants therein are already activated when the buffer layer is epitaxially grown. Better device performance is achieved with the new and improved configuration and the manufacturing method.

Figure 1:
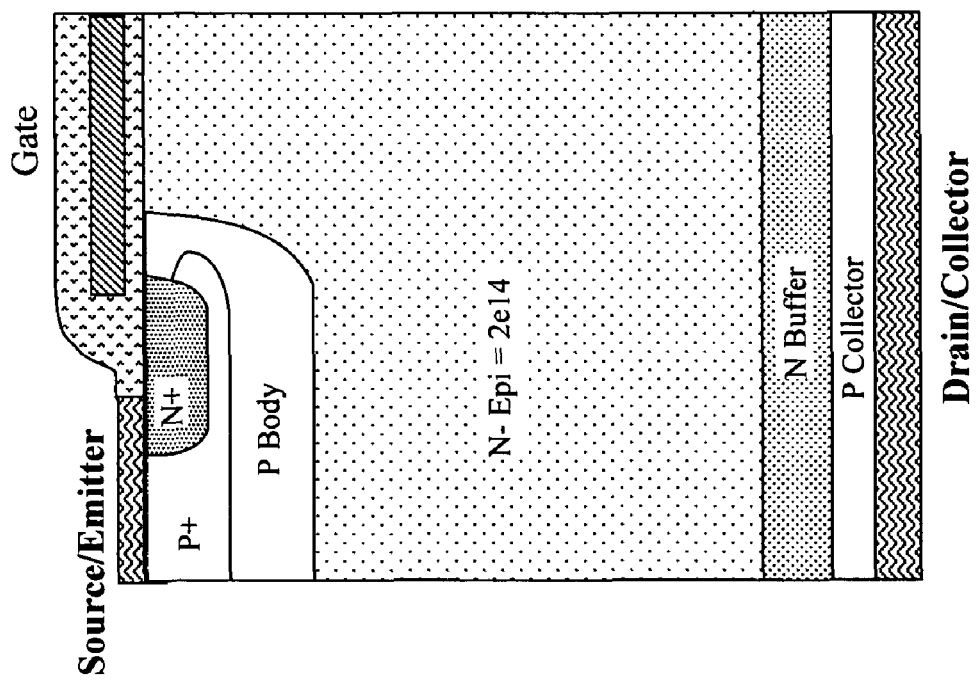
FIG. 1 is a cross sectional view for showing a conventional IGBT.
Figures 1, 1A, 2, 3:
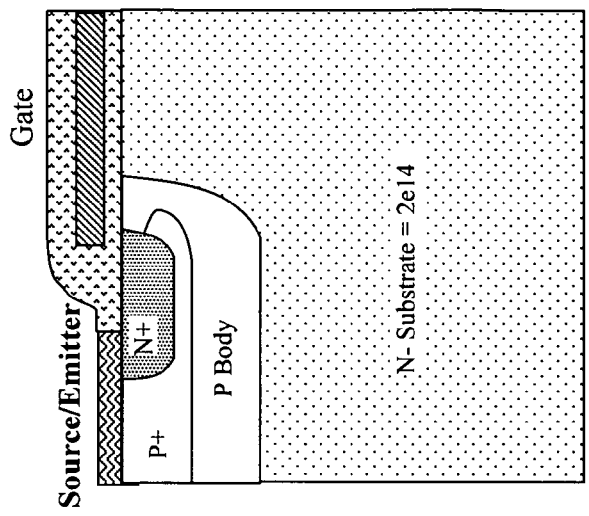
Figures 1, 1A, 2:
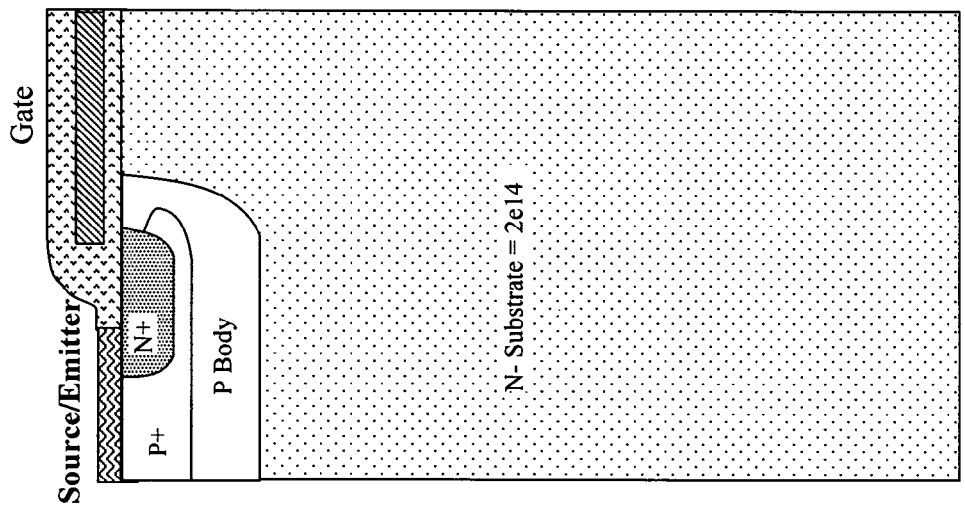
Figures 1, 1A:
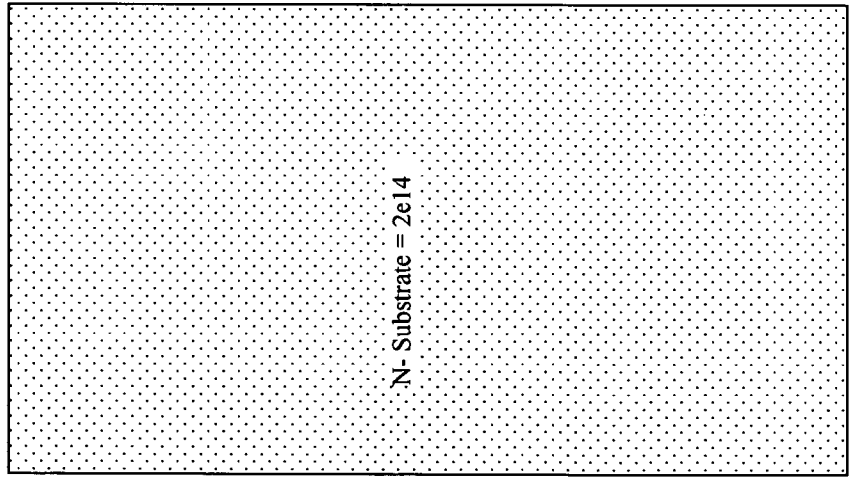
Figures 1, 1A, 2, 3, 4, 5:
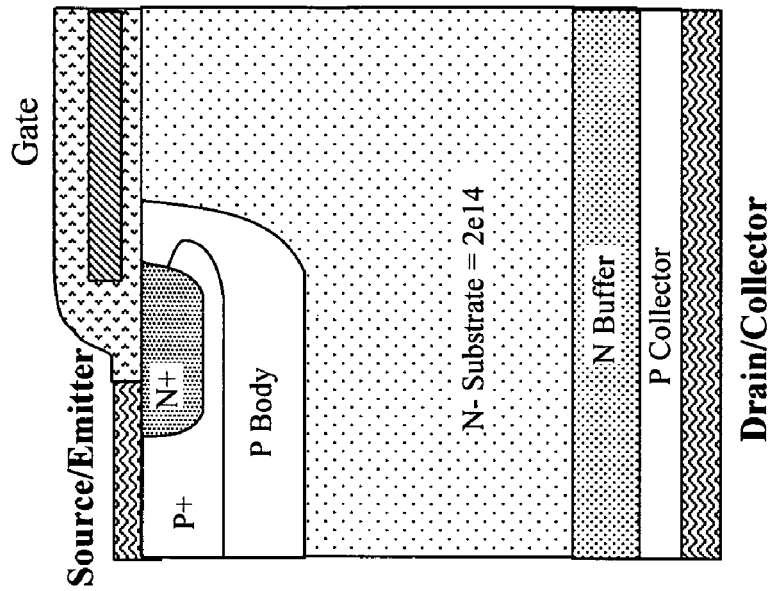
Figures 1, 1A, 2, 3, 4:
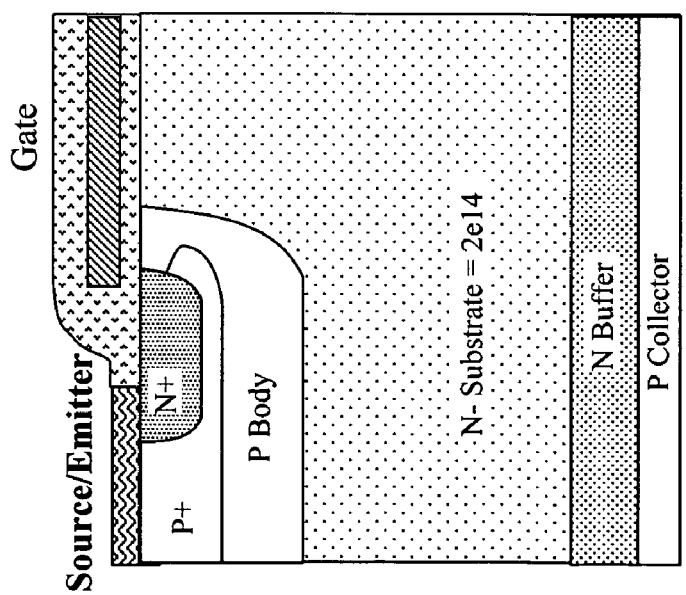
Figures 1, 1B, 2, 3:
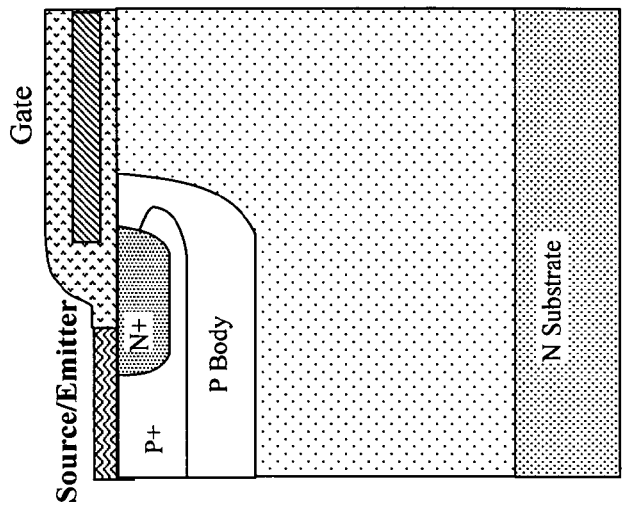
Figures 1, 1B, 2:
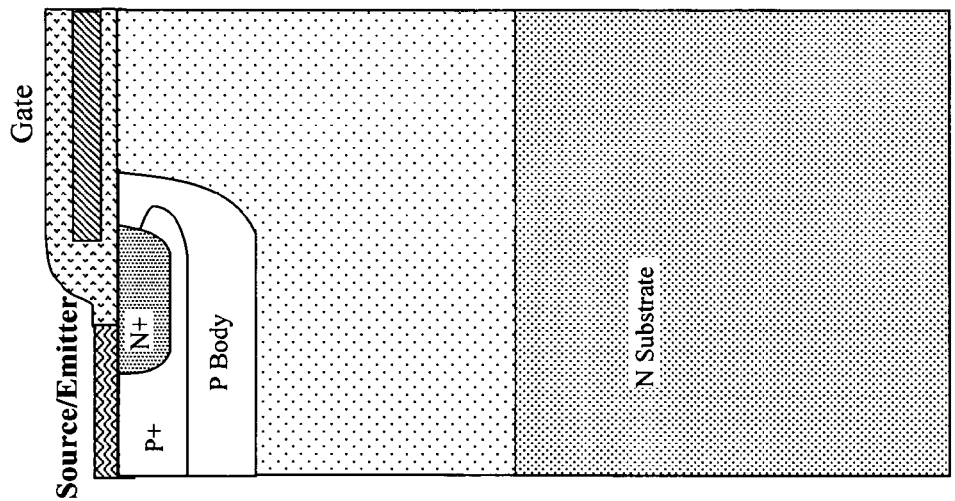
Figures 1, 1B:
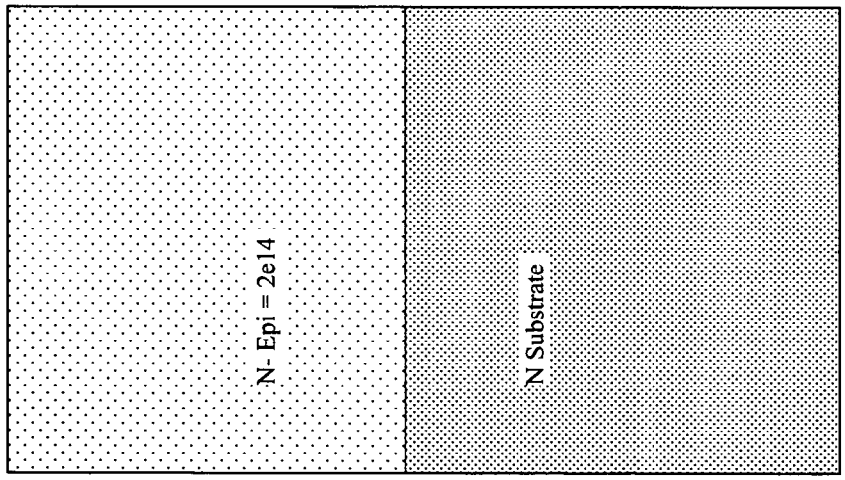
Figures 1, 1B, 2, 3, 4, 5:
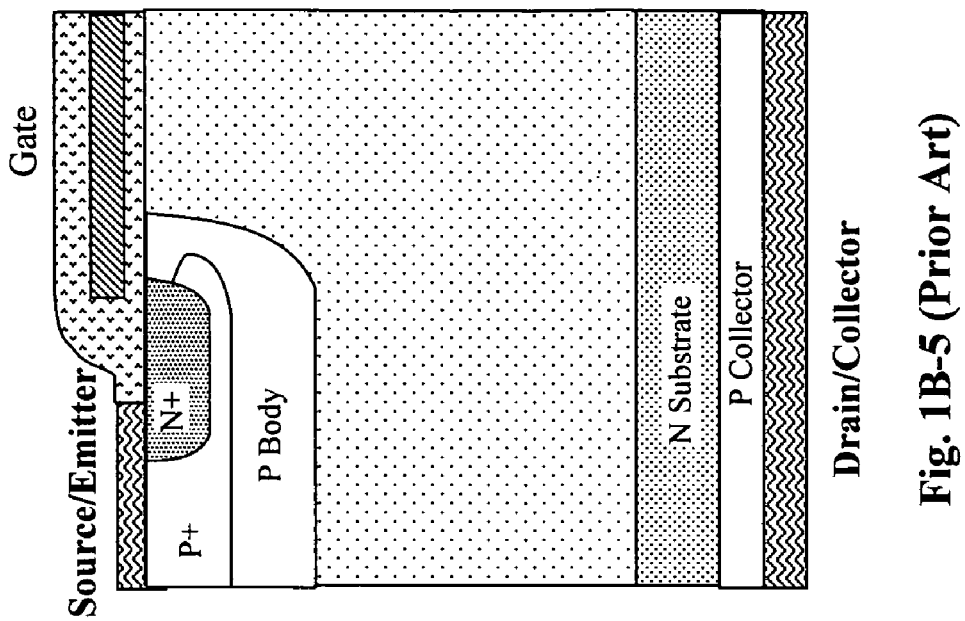
Figures 1, 1B, 2, 3, 4:
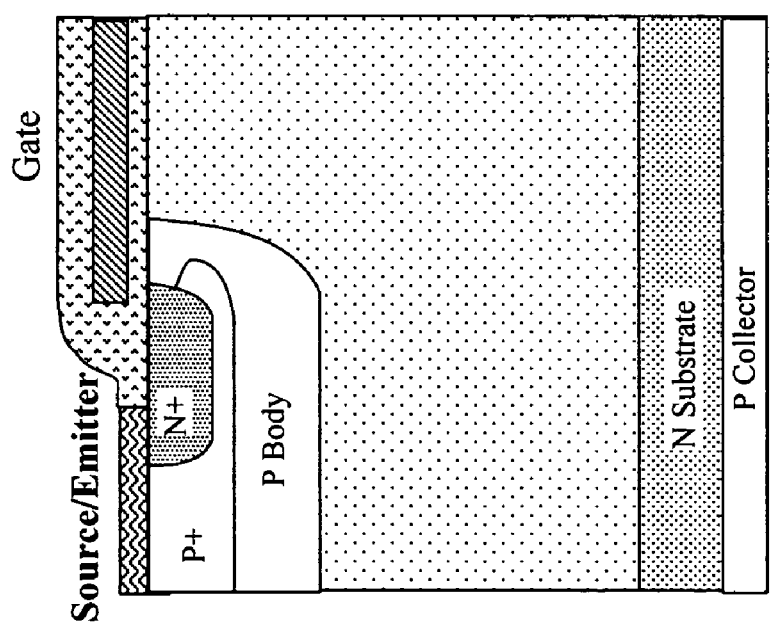
Figure 2C:
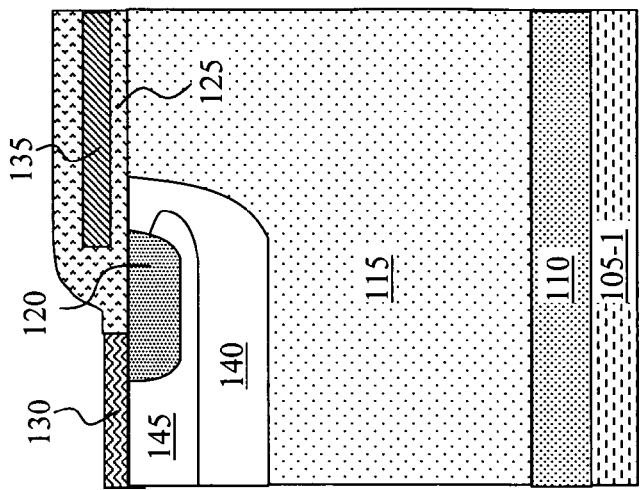
Figure 2B:
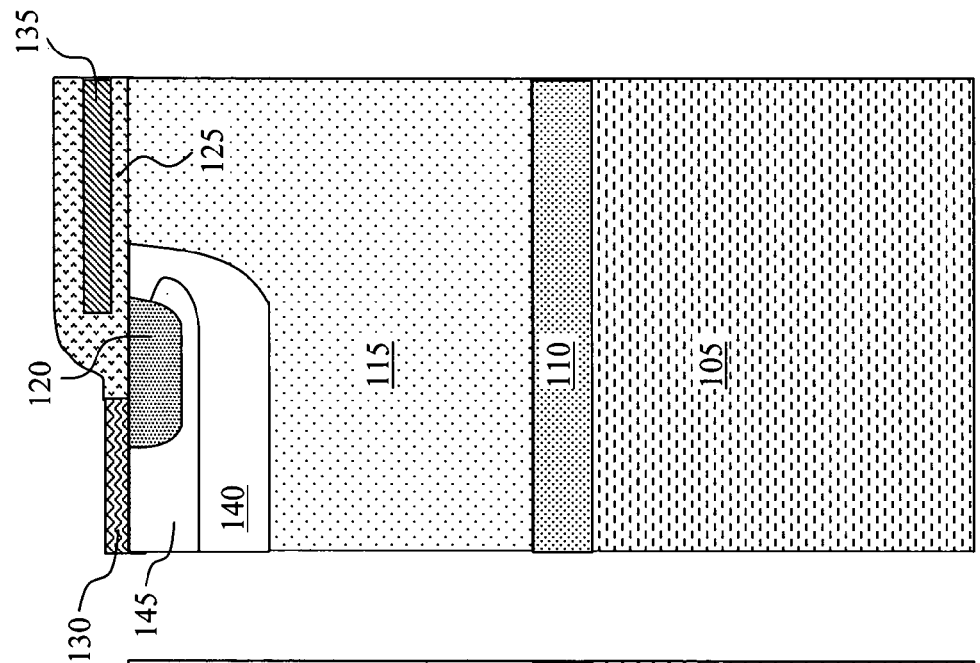
Figure 2A:
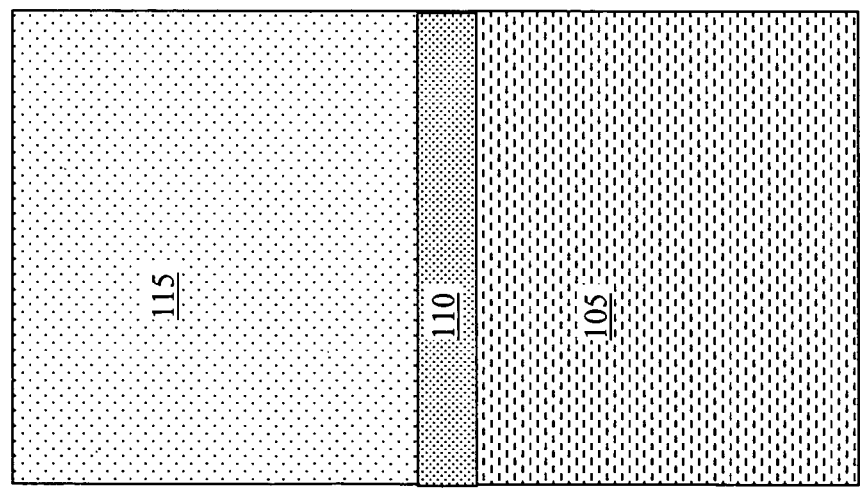

FIGS. 2A to 2E are a series of cross-sectional views for illustrating the processes for manufacturing a field stop IGBT device of this invention. FIG. 2A shows a lowly doped semiconductor substrate 105 supporting a first (N−) epitaxial layer 110 and a second (N−) epitaxial layer 115 as double (N-type) epitaxial layers. The first N-epitaxial layer 110 is formed with the proper thickness and doping concentration to produce the desired per area charge concentration of the (n-type) IGBT buffer layer (e.g. $2.5E12/cm^2$). FIG. 2B shows the front side of an IGBT device 100 formed as a vertical IGBT. The IGBT 100 is a vertical IGBT device with a source/emitter electrode 130 disposed on a top surface. A gate 135 is supported on top of a gate insulation layer 125 (e.g. gate oxide). An (N+) source region 120 is formed underneath the source/emitter electrode 130 encompassed in a (P+) body contact region 145 and (P) body region 140 extended below and to the side of (N+) source region 120 to a region underneath the gate insulation layer 125. When a gate voltage exceeding a threshold voltage is applied, the MOSFET turns on which then turns on the (PNP) bipolar transistor of the IGBT. An electrical current is conducted from the source region 120 and the P+ body contact region 145 through the P-body region 140 to the N-epitaxial layer 115 and the (N-type) buffer layer 110 to the lowly doped substrate 105-1 and P-type layer 104 and then to the collector electrode 101 attached at the bottom surface, as shown in FIG. 2E.

After the processing steps are completed to form the top side IGBT device structures, FIG. 2C shows the manufacturing process proceeding by carrying out a back grinding to grind the back of the lowly doped substrate layer 105 down to a remaining lowly doped substrate layer 105-1 having a predefined thickness. The lowly doped substrate layer 105 (and 105-1) may be very lowly doped P-type or N-type, or intrinsic semiconductor in FIG. 2A through 2C. In FIG. 2D, the P-type layer 104 is formed at the bottom surface of the remaining lowly doped substrate layer 105-1, e.g. by backside (P dopant) implant. In FIG. 2E, a metal layer 101 is formed on the bottom surface. The first N-epitaxial layer 110 is initially formed in FIG. 2A so that it already starts with the thickness and doping concentration desired for the buffer layer. No further annealing or processing is required for the buffer layer 110. Thus the buffer layer 110 has its charge level set regardless of back grinding variations and does not require any late stage annealing processes. The (P-type) collector region is formed from the P-type layer 104. The remaining substrate layer 105-1 is lowly doped, so it does not contribute much charge to the overall P collector region charge. Thus back grinding variations do not greatly affect the charge level of the P collector regions 104 or the N buffer layer 110. The substrate layer 105/105-1 can be lowly doped P-type, lowly doped N-type, or intrinsic semiconductor. The P-type layer 104 will be limited to a low temperature anneal process as before. However, this layer does not form a blocking junction and only requires moderate doping levels in order to limit the gain of the PNP transistor which controls the switching losses. Thus, partial activation of the P collector layer is suitable to achieve a good trade-off point between switching and conduction losses in a Field Stop IGBT. The charge level of the collector region is still important, but it is not as critical to have a high percentage of the implanted dopants activated, or to anneal all the implantation damage. By way of example, the charge level of the collector layer can be about $1E13/cm^2$. Therefore, even though a low temperature anneal might only activate a low percentage of the implanted dopants, as long as the total number of activated dopants is controlled, the device will perform well.

By way of example but not by way of limitation, the low temperature anneal of the collector region can be produced by a number of techniques including oven heating, laser anneal, or microwave anneal. The annealing of the collector region can also be performed as the collector electrode metal anneal.

The above processing steps disclose an insulated gate bipolar transistor (IGBT) formed in a semiconductor substrate. The IGBT comprises a buffer layer of a first conductivity type formed below an epitaxial layer of the first conductivity for forming body and source regions therein and supporting a gate electrode of the IGBT thereon. Of course, a trench gate can be used instead of a planar gate. The IGBT further includes a lowly doped substrate layer and a dopant layer of a second conductivity type disposed below the buffer layer and above a drain/collector electrode of the IGBT attaching to a bottom surface of the semiconductor substrate wherein the dopant layer of the second conductivity type has a higher dopant concentration than the lowly doped substrate layer, wherein the lowly doped substrate layer of the second conductivity type is disposed above the dopant layer of the second conductivity type. In a preferred embodiment, the buffer layer of the first conductivity type is an N-type buffer layer disposed below an N-type epitaxial layer. A P-type body region and an N-type source region are formed in the N-type epitaxial layer. The bottom dopant layer of the second conductivity type comprise a P-type layer the P-type layer having a greater P concentration than lowly doped substrate layer. In a specific embodiment, the buffer layer of the first conductivity type is an N-type buffer layer having a dopant concentration ranging from 5e15 to 1e16 cm$^{-3}$ and a thickness ranging from 5 to 10 μm (e.g., about 2.5e12 cm$^2$). In another specific embodiment, the dopant layers disposed below the buffer layer comprise a lowly doped substrate layer having a P-type or N-type concentration ranging from 1e13 to 1e15 cm$^{-3}$ (or less than 1e15 cm$^{-3}$) or intrinsic semiconductor, and a P-type layer having a P-type charge concentration ranging from 5e16 to 5e18 cm$^{-3}$ and a thickness around 0.5 □m (e.g., about 1e13 cm$^{-2}$) disposed below the lowly doped substrate layer. The thickness of the bottom P-type layer acting as the collector region may be about 0.5 um. The thickness of the remaining lowly doped substrate layer is not critical—the important thing is for the backgrinding process to not reach all the way to the buffer layer. For example if the backgrinding technology has a margin of +/−2 um, the manufacturer might aim to back grind the lowly doped substrate down to about four or five microns deep. In another preferred embodiment, the buffer layer of the first conductivity type is an N-type buffer layer disposed below an N-type epitaxial layer having a P-type body region and an N-type source region formed therein, wherein the N-type buffer layer comprises an N-type layer having defect free layer characteristics or activated at a high temperature characteristics.

In another embodiment, the buffer layer of the first conductivity type is a P-type buffer layer disposed below a P-type epitaxial layer having an N-type body region and a P-type source region therein. A lowly doped substrate layer may be located under the P-type buffer layer. An N-type collector layer may be located under the lowly doped substrate said lowly doped substrate layer having a smaller dopant concentration than the N-type collector layer.

Compared to the conventional manufacturing method, the processes disclosed in this invention has an advantage of requiring only a single backside implant instead of multiple backside implantations as that required in the conventional processes. Since the buffer region has already been provided in the starting semiconductor material, there is no additional annealing process required unlike the conventional processes. Furthermore, the thickness variation of the lowly doped substrate when carrying out the back grinding does not affect the buffer or collector layer charges. The requirements to tightly control the backside processes are therefore relaxed. More reliable and higher performance IGBTs can be manufactured with simplified and more controllable processing steps.

In essence this invention discloses a method for manufacturing semiconductor power device. The method includes a step of growing an epitaxial layer of a first conductivity type on a lowly doped semiconductor substrate. The method further includes growing the epitaxial layer such that a bottom of the epitaxial layer is formed as a buffer layer having a precisely controlled amount of layer charges before carrying out processing steps on a top portion of the epitaxial layer to form a top portion of the semiconductor power device. Later, the bottom of the lowly doped semiconductor substrate is back-grinded though not all the way to the buffer layer. Next, the bottom of the back-grinded substrate is doped, e.g. by implantation, to form a dopant layer of the second conductivity type to act as the collector region.

Although the present invention has been described in terms of the presently preferred embodiment, it is to be understood that such disclosure is not to be interpreted as limiting. Various alterations and modifications will no doubt become apparent to those skilled in the art after reading the above disclosure. For example, though an N-channel IGBT device was usually shown, the invention could easily have been applied to a P-channel IGBT, by reversing the polarities of the regions and layers. Also, though a planar gate IGBT was shown, this invention could easily be applied to a trench gate IGBT as well. Accordingly, it is intended that the appended claims be interpreted as covering all alterations and modifications as fall within the true spirit and scope of the invention.

We claim:

1. A method for manufacturing a vertical insulated gate bipolar transistor (IGBT) comprising:
    growing a first epitaxial layer of a first conductivity type over a lowly doped semiconductor substrate;
    growing a second epitaxial layer of the first conductivity type over the first epitaxial layer; and
    annealing and processing the semiconductor to prepare the first epitaxial layer serves as a buffer layer for the IGBT having a precisely controlled amount of layer charges.

2. The method of claim 1 wherein:
    said step of growing the first and second epitaxial layers are steps of growing a first and second N-type epitaxial layers on a lowly doped substrate.

3. The method of claim 1 wherein: said step of growing the first epitaxial layer is a step of growing the first epitaxial layer having a dopant concentration ranging from 5e15 to 1e16 cm$^{-3}$ and a thickness ranging from 5 to 10 μm.

4. The method of claim 1 wherein:
    the step of growing the first epitaxial layer of the first conductivity type is a step of growing the first epitaxial layer as an N type epitaxial layer.

5. The method of claim 1 wherein:
    the step of growing the first epitaxial layer of the first conductivity type is a step of growing the first epitaxial layer of as a P type epitaxial layer.

6. The method of claim 1 wherein:
    the step of growing a first epitaxial layer of a first conductivity type over a lowly doped semiconductor substrate is a step of growing the first epitaxial layer of the first conductivity type over a semiconductor substrate having a charge concentration ranging from 1e13 to 1e15 cm$^{-3}$ or intrinsic semiconductor.

7. The method of claim 6 wherein: said step of growing the first epitaxial layer is a step of growing the first epitaxial layer having a dopant concentration ranging from 5e15 to 1e16 cm$^{-3}$ and a thickness ranging from 5 to 10 μm.

8. The method of claim 1 further comprising:
carrying out processing steps on a top portion of second epitaxial layer to form a body region of the second conductivity type encompassing a source region of the first conductivity type;
back-grinding the lowly doped semiconductor substrate from the bottom surface to grind the substrate to a controlled backside thickness, wherein the backgrinding does not reach the first epitaxial layer.

9. The method of claim 8 further comprising:
doping a bottom of the back-grinded lowly doped semiconductor substrate with dopant of the second conductivity type to form a bottom semiconductor layer of the second conductivity type with a higher dopant concentration than a dopant concentration of the lowly doped semiconductor substrate.

10. The method of claim 9 further comprising:
forming a bottom metal layer on a bottom surface below the bottom semiconductor layer of the second conductivity type to function as a collector electrode of said IGBT.

* * * * *